United States Patent Office
3,448,089
Patented June 3, 1969

3,448,089

PHOTOPOLYMERIZABLE POLYMERS CONTAINING FREE ACID OR ACID ANHYDRIDE GROUPS REACTED WITH GLYCIDYL ACRYLATE OR GLYCIDYL METHACRYLATE

Jack Richard Celeste, Westfield, N.J., assignor to E. I. du Pont de Nemours and Company, Wilmington, Del., a corporation of Delaware No Drawing. Filed Mar. 14, 1966, Ser. No. 533,817
Int. Cl. C08f 27/12; G03c 1/68
U.S. Cl. 260—78.5 6 Claims

ABSTRACT OF THE DISCLOSURE

The addition-polymerizable (crosslinkable) polymeric compounds are copolymers containing recurring units from vinyl or vinylidene monomers having at least one of the extralinear radicals:

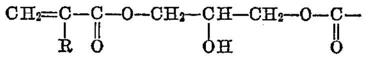

and

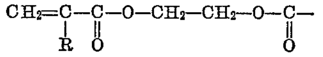

attached to an intralinear unit and an extralinear radical Y attached to an adjacent intralinear unit or adjacent carbon atom and comprising a carboxyl function; R is —H or methyl.

This invention relates to new addition polymerizable polymeric compounds and compositions.

Crosslinkable polymeric compositions are, of course, well known in the art of polymer chemistry. Printing plates utilizing photosensitive monomeric and polymeric compositions are also known. However, in many cases it is necessary to incorporate auxiliary polymeric materials to act as binders and carriers for the photosensitive material. This is quite true for photosensitive compositions comprising monomeric compounds. In general, monomer-binder systems are sensitive to oxygen desensitization and oxygen-induced reciprocity law failure.

The new addition-polymerizable (crosslinkable) polymeric compounds of this invention are copolymers containing recurring units from vinyl or vinylidene monomers having at least one of the extralinear radicals:

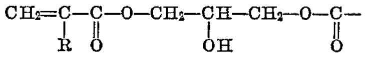

and

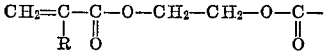

attached to an intralinear unit and an extralinear radical Y attached to an adjacent intralinear unit or adjacent carbon atom and comprising a carboxyl function. The polymer compounds can be represented by the formula:

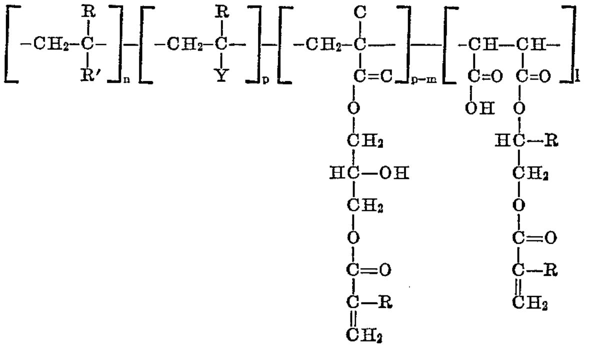

where R′ is —C≡N,

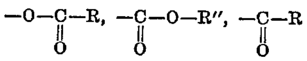

phosphinate, pyrroidone, alkoxy or halogen, R is —H or methyl, and R″ is alkoxy, alkyl of 1–18 carbon atoms, cycloalkyl, aralkyl, aryl. Suitable specific radicals include methoxy and ethoxy; methyl, ethyl, dodecyl and octadecyl; cyclobutyl, cyclopentyl and cyclohexyl; benzyl and menaphthyl; and phenyl and naphthyl. Suitable radicals comprising a carboxyl function for Y include —COOH and

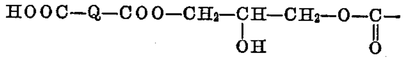

where Q is alkylene of 1–4 carbon atoms e.g. ethylene or arylene, e.g., phenylene.

*n* is zero or a positive integer
*m* is zero or a positive integer
*p* is zero or a positive integer greater than *m*
*l* is zero when either *p* or *m* are positive integers and *l* is a positive integer when *p* and *m* are both zero.

The novel addition-polymerizable acid polymers referred to above can be made in accordance with the equations set forth below. In these equations the symbols have the same values as given in the formulas set forth above.

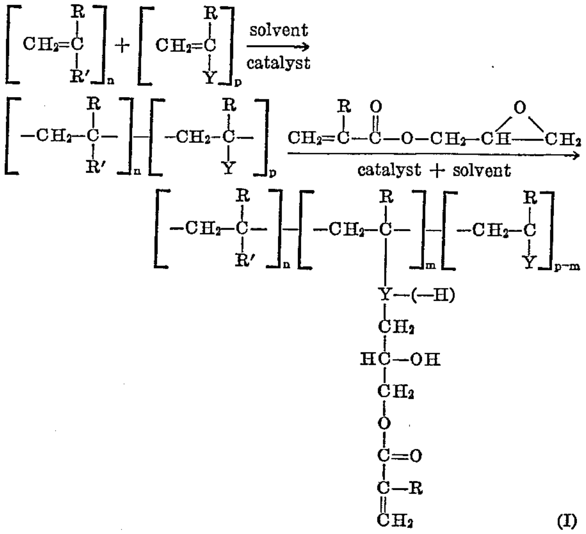

(I)

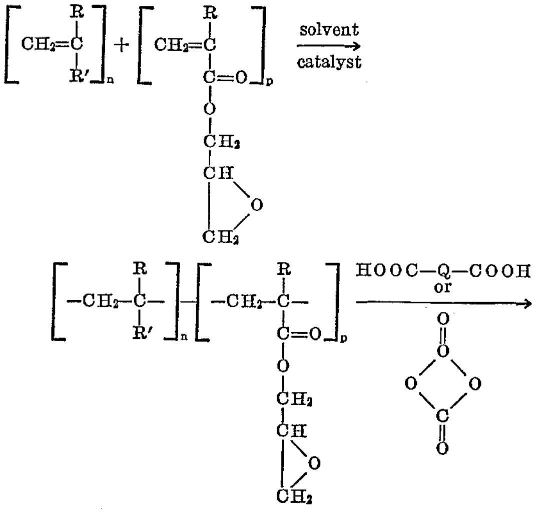

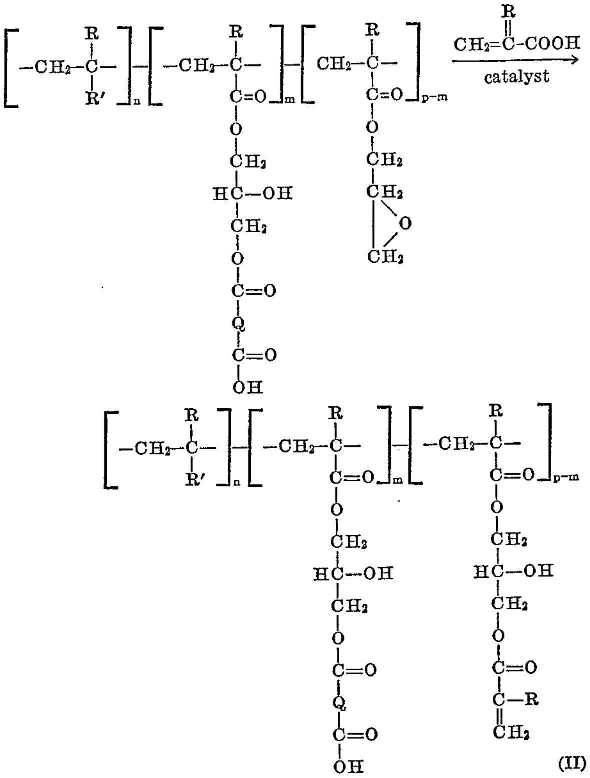

(II)

sence or absence of unesterified carboxyl groups. By varying the concentrations of the monomer backbone, the acidic function and the epoxide, a large number of useful polymers can be prepared. In general, at least 5 mole percent of acid groups are necessary for alkali solubility. The exposed portions of the layer become insoluble and resistant to the conventional etching solutions such as ferric chloride.

The preferred polymers containing acid groups are the polymers of acrylic and methacrylic acid or unsaturated acid anhydrides with polymerizable vinyl compounds, i.e., compounds having a terminal methylene group attached through a double bond to the adjacent carbon atom. These preferred materials include the polymers and copolymers of acrylic and methacrylic acid formed with acrylic and methacrylic acid esters and nitriles, e.g., methyl acrylate, methyl methacrylate, ethyl acrylate, ethyl methacrylate, 2-hydroxyethyl methacrylate, n-butyl methacrylate, isobutyl methacrylate, and propyl, isopropyl, sec-butyl, tert.-butyl, amyl, hexyl, heptyl, etc., acrylate and methacrylate, acrylonitrile, and vinyl esters, e.g., vinyl acetate, vinyl propionate, vinyl butyrate, vinyl isobutyrate, vinyl valerate and bis(beta-chloroethylphosphin acrylate). All of the copolymers just described are known.

The new copolymers of this invention are made by reaction of a polymer containing the free acid group or acid anhydride group with a glycidyl acrylate to form an unsaturated cross-linkable polyester. The crosslinkable polymers and copolymers of the prior art rely on the opening of the epoxide group for crosslinking. In the novel copolymers of this invention, polymerization is accomplished through the terminal unsaturated ethylenic groups attached to the copolymer by reaction between the epoxide ester and acid groups.

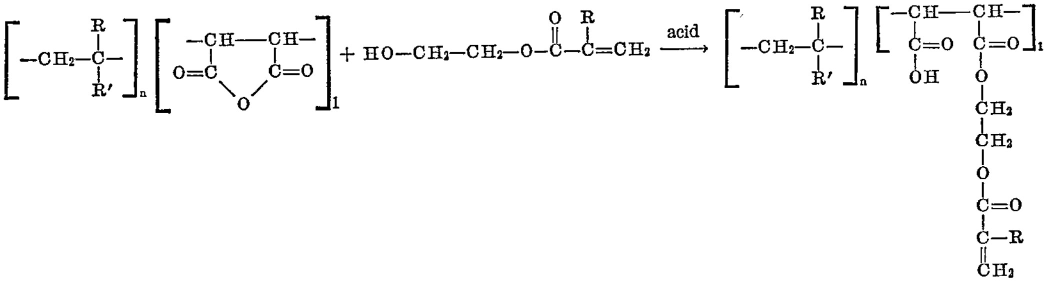

In preparing the novel photopolymerizable polymers, the first step is to prepare by addition polymerization the polymer or copolymer containing free acid, i.e., acrylic acid or methaycrylic acid. The monomers may be any vinyl or vinylidene compound. The polymers or copolymers are then reacted with glycidyl acrylate or glycidyl methacrylate to form unsaturated esters of the linear polymeric compounds. During this reaction, a polymerization inhibitor, that is, one which is adapted to prevent polymerization through the ethylenically unsaturated group of the glycidyl ester, must be present in the reaction mixture. Copper metal, cuprous salts, cupric salts, phenyl-α-napthylamine, 2,2-methylene-bis(4-ethyl-6-tertiary butylphenol) and N,N'-di-2-naphthyl-p-phenylenediamine have been found suitable for this purpose. The resulting polymerizable polymers can be coated on a suitable support from an organic solvent solution or an aqueous alkali solution to form a highly useful photorelief. The usual photoinitiators and other ingredients such as plasticizers, thermal inhibitors, colorants, fillers, etc., also may be present as is well-known in the art. After imagewise exposure to actinic radiation, the unexposed portions of the layer may be removed by washing with a liquid which is a solvent for the unexposed polymeric composition but in which the exposed polymerized polymeric composition is essentially insoluble. Aqueous alkali solutions or chlorinated hydrocarbon solvents are quite suitable for this purpose as well as being useful as the coating vehicle depending, of course, on the presence or absence ...

The glycidyl ester reactant is available commercially or can be made in a variety of ways, one of which is that disclosed in Dorough U.S. Pat. 2,524,432. A general preparation of the copolymeric glycidyl acrylate type ester is to set up a suitable reaction flask equipped with a stirring means, a heating means and reflux condenser. The selected organic solvent is added and heated to reflux with stirring for at least five minutes to remove any dissolved oxygen. The monomer mixture containing a "free radical" addition polymerization initiator is added in small portions with stirring while refluxing the mixture to control the exothermic polymerization reaction. After all of the monomer/initiator mixture has been added, the mixture is refluxed for about 22 hours. The mixture is cooled slightly for a small amount of cuprous oxide and copper wire is added to inhibit polymerization of the ethylenic group of the glycidyl acrylate ester which is added with a tertiary amine catalyst to the reaction mixture. The mixture is heated to reflux for at least 17 hours. The mixture is then cooled and added to a large volume of violently agitated water or some other suitable non-solvent, such as n-hexane. The resulting precipitate is filtered and washed with clean water several times and dried in moving air at 34–40° C. Alternatively, the refluxed reaction mixture may be passed through an ion exchange column containing an ion exchange resin in basic form to remove the copper ions and excess acid. The resulting eluate is dried by azeotropic distillation or by a chemical drying agent. The purification procedure may also be carried out using activated alumina.

To form, for example, a photosensitive layer for use as a photoresist, a solution of the polymerizable copolymer in a suitable solvent is made up in a concentration of 10–50% solids and coated on a support, and dried. Photoinitiators and plasticizers and, optionally, an inert polymeric filler are also added to the coating solutions along with a small amount of an antioxidant. After drying, the layer may be laminated to an adhesive coated support and imaged by exposure to actinic radiation through a lithographic negative in a conventional vacuum printing frame. Generally about a 30-second exposure to a carbon arc source is sufficient. After exposure, the image can be developed by bathing the element in a liquid which is a solvent for the unexposed polymer but in which the exposed polymer is essentially insoluble. After development, the relief image is suitable for many printing applications. The above polymerizable, polymeric compositions and photoreliefs made therefrom are particularly useful in the graphic arts field, i.e., letterpress, planographic, intaglio, etc.

This invention will now be further illustrated in and by the following examples. All parts are by weight unless otherwise specified.

EXAMPLE I

In a 2-liter, three-necked, round bottom, flask equipped with a mechanical stirrer, a water-cooled reflux condenser a dropping funnel and an electric heating mantle, there was charged 950 ml. of dimehyl formamide which was heated to reflux for five minutes. To the dropping funnel there was added a mixture of 39 grams methyl methacrylate (containing 50 p.p.m. of p-methoxy phenol as an inhibitor), 64.3 grams of methacrylic acid, and 1 gram of N,N'-azo-bis-iso-butyronitrile as a catalyst. Addition of 1/13 by volume of the mixture was carried out rapidly while stirring the mixtue under reflux. This was repeated every 10 minutes and controlled the exothermic polymerization reaction. After the final addition, the stirring was stopped and the mixture was heated at reflux for two hours. The reaction mixture was cooled slightly and 0.5 gram of cuprous oxide and some copper wire was added. To the reaction mixture there were then added 48 grams of glycidyl acrylate and 29.0 grams of N,N-diethylcyclohexylamine as a catalyst. The mixture was then heated to 80° C. for 24 hours. At the end of the refluxing period, the reaction mixture was cooled and the crosslinkable copolymer containing extralinear $$CH_2{=}CH{-}\overset{\overset{\displaystyle O}{\|}}{C}{-}O{-}CH_2{-}\overset{\overset{\displaystyle OH}{|}}{C}H{-}CH_2{-}O{-}\overset{\overset{\displaystyle O}{\|}}{C}{-}$$

groups and —COOH groups attached to respective nonadjacent chain carbon atoms was extracted and purified by passing the copolymer mixture through an ion exchange resin column containing a weakly acid resin (Amberlyte IRC–50—Rohm & Haas) in dimethylformamide and then through an ion exchange resin column containing a weakly basic resin (Amberlyst A–21 Rohm & Haas). The product was obtained as a 5% solution in dimethylformamide. The copper catalyst remained in the reaction vessel.

A coating solution was made up containing 140 grams of the above solution (5.4 grams dry solids), 0.12 gram of 2-t-butylanthraquinone, and 0.48 gram of triethylene glycol diacetate. The resulting solution was dip-coated on a copper-clad fiberglass support intended for use as a printed circuit. Just prior to coating, the copper surface of the support was degreased and cleaned by vapor spraying with 1,1,2-trichloroethylene, scouring with an abrasive powder, rinsing with water, soaking for one minute in 6 N hydrochloric acid, washing with water and drying. After coating, the photosensitive layer was air dried and then exposed for 60 seconds through a lithographic type negative in a conventional vacuum printing frame by means of a carbon arc exposing device identified as a "Nu-Arc Plate Maker (flip flop)" Model FT 26M–2 made by Nu-Arc Company, Chicago, Ill. After exposure, the resist image was developed by bathing in warm water which removed all of the unposed polymeric material, leaving a highly useful resist image on the copper-clad support. This resist image may be used to prepare a printed circuit by submiting the resist image to the ferric chloride etching process described above which leaves a high quality relief image under the resist.

The exposed photopolymer remaining need not be removed but if desired, it may be by soaking the resist in methylene chloride which swells the polymerized polymer so that it may be removed by mechanical scrubbing.

EXAMPLE II

The procedure of Example I was repeated using 2480 ml. of methyl ethyl ketone in place of the dimethyl formamide and the following monomeric compounds and the catalyst of Example I.

| | Grams |
|---|---|
| Methyl methacrylate | 26.9 |
| Methacrylic acid | 23.1 |

The copolymerization reaction was carried out by refluxing the mixture for 24 hours. The methyl ethyl ketone which allowed the formation of a higher molecular weight polymer than when dimethylformamide was used during the copolymerization as in Example I was distilled off and simultaneously 450 ml. of dimethylformamide was added together with 4.1 grams of an N,N-diethylcyclohexylamine and 17.2 grams of glycidyl acrylate. Cuprous oxide and copper wire were added and the mixture refluxed for 20 hours. At the end of the refluxing period, the crosslinkable polymeric product was extracted and purified by passing the reaction mixture through an ion exchange resin column containing a weakly acid resin (Amerlyte IRC–50—Rohm & Haas), and then through a column containing a weakly basic resin (Amerlyst A–21—Rohm & Haas). There resulted a 3.1% solids solution in dimethylformamide.

The photopolymerizable copolymer containing the same extralinear groups as that of Example I was made up into a photopolymerizable composition containing 9 grams of the material, 0.8 gram of triethyleneglycol diacetate, and 0.2 gram of 2-t-butylanthraquinone. The resulting solution was coated on a grained aluminum plate (typical for lithographic use) and air dried to give a dry thickness of 0.2–0.3 mil. The resulting element was suitably exposed and then developed by bathing in a 0.5% aqueous solution of sodium hydroxide. The element was then rinsed in water and dried. The exposed areas remain and are hydrophobic. The background is clean and hydrophilic and the plate is suitable for lithographic printing.

EXAMPLE III

Example II was repeated except that 1800 grams of diethyl ketone was used as a solvent together with the following ingredients:

| | Grams |
|---|---|
| Methyl methacrylate | 53.8 |
| Methacrylic acid | 46.2 |

After refluxing 7 hours, 500 grams of dimethylformamide was added and the mixture refluxed over night.

After the copolymerization reaction was carried out as described, there were added 34.4 grams of glycidyl acrylate, 0.5 gram of 2,2-methylene bis(4-ethyl-6-tertiary butylphenol) and 8.4 g. of an N,N'-diethylcyclohexylamine as a catalyst. The mixture was refluxed for 7 hours and at the end of the refluxing period, the crosslinkable copolymer like that of Example I was extracted and purified as described in Example I. An 8.6% solids solution was obtained.

The polymerizable copolymer solution resulting from the above procedure was made up into a photopolymerizable coating having the following composition:

| | G. |
|---|---|
| Crosslinkable copolymer solution (22 grams dry) | 255 |
| 2-t-butylanthraquinone | 0.5 |
| Triethylene glycol diacetate | 2.5 |

The photoresist solution was coated on a polytetrafluoroethylene film and the coated film (about 0.017 inch thick) was press laminated to an adhesive coated support and the polytetrafluoroethylene film was removed by stripping. The resulting element was exposed and processed as described in Example II to give a satisfactory letterpress printing plate.

EXAMPLE IV

The procedure of Example I was repeated except that a 1-liter reaction flask was charged with 500 ml. methyl ethyl ketone as the reaction solvent and the following monomeric compounds were used with 1.2 grams of the "azo" catalyst of Example I.

| | G. |
|---|---|
| Methyl methacrylate | 50.0 |
| Glycidyl acrylate | 64.0 |

The mixture was heated to reflux for 20 hours. At the completion of the copolymerization reaction and after the addition of the cuprous oxide and copper wire, there were added 10.0 grams of succinic anhydride, 38.8 grams of N,N'-diethylcyclohexylamine as a catalyst and 2.6 grams of 2,2'-methylene-bis(4-ethyl-6-t-butyl phenol). After refluxing for 5 hours, to the mixture was added 100 grams of acrylic acid and the mixture was refluxed for 15 hours more. The resulting solution of a copolymer containing extralinear

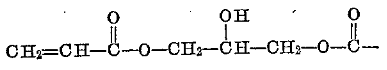

groups and

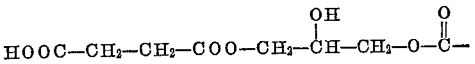

groups, respectively, attached to non-adjacent chain carbon atoms was purified and made up into a coating composition, coated, exposed and developed as described in Example II to give a printing plate similar in characteristics to that obtained in Example II.

EXAMPLE V

The procedure of Example IV was repeated using 11.4 grams of glutaric anhydride in place of succinic anhydride and a highly useful printing plate was obtained.

EXAMPLE VI

A crosslinkable polymer was formed according to the reaction:

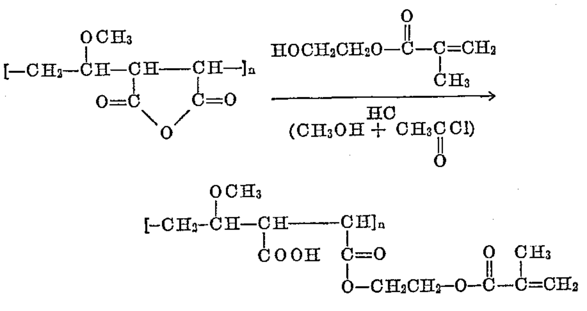

In a 5-liter, 3-neck flask, 150 grams of 1:1 copolymer of maleic anhydride/methyl vinyl ether, (avg. N.W. 250,000) and 1.5 grams of the compound 2,2'-methylene-bis(4-ethyl-6-t-butylphenol) as a thermal inhibitor were dissolved in 3,000 ml. of acetone with mechanical stirring under a stream of nitrogen. To this solution 150 ml. of 2-hydroxyethyl methacrylate (96% pure), and 6.0 ml. of methanol were added followed by the dropwise addition of 10.0 ml. of acetyl chloride. The resulting solution was stirred under a stream of nitrogen at room temperature for 22 hours. The product was concentrated under reduced pressure to ¼ of its original volume then made up with acetone to a volume of 1,000 ml.

A photopolymerizable coating solution was made having the following composition:

| | G. |
|---|---|
| Product from the above reaction | [1] 12.0 |
| Triethylene glycol diacetate | [1] 1.27 |
| 2-t-butylanthraquinone | [1] 0.067 |

[1] Dissolved in 50-ml. acetone.

The solution was coated on a support to give a dry coated thickness of about 0.015 inch. Images could be obtained from exposures of over 30 sec. to the carbon arc described in Example I with or without the use of vacuum, and developed in 0.01 N NaOH followed by water rinse. The element was then rinsed with a 0.1 N hydrochloric acid and again rinsed with water. The resulting element was useful as a letterpress printing plate.

The proportions of the ethylenically unsaturated acids or anhydrides and the monomeric materials which may be copolymerized therewith may be varied over a wide range depending on the characteristics desired in the polymerizable polymer such as, for example, solubility in dilute aqueous alkaline solutions, the adhesion to a support when the material is coated to form a relief printing plate and the photographic speed when activated by a photoinitiator activatable by actinic radiation. As indicated by the above examples, the amount of ethylenically unsaturated acid or anhydride may be as high as 100% by weight and as low as 10% based on the total weight of polymerizable materials. If there is appreciably less than 10% of polymerized acid and/or anhydride compound based on the total weight of polymerizable materials, there will not be enough free acid groups present to react with the glycidyl ester to provide a sufficient number of appending unsaturated groups for photopolymerizing. That is, the number of available unsaturated groups and free acid groups will be in such short supply that the photopolymerizing reaction will not provide a sufficient difference in solubility between the exposed and unexposed areas of the photoresist to allow development of the image by solvent washing. On the other hand, if the acid portion is present in proportions approaching 100% based on the total weight of polymerizable materials, then the polymerization becomes difficult to carry out since polymeric acids are not soluble in most of the useful solvents. In addition, many of the vinyl comonomers are less expensive than the acid esters, therefore, the use of higher quantities of the latter is economically unattractive.

It will be understood, of course, by those skilled in the art that this invention is not limited to the specific ingredients named in the above illustrative examples nor to the particular proportions and methods of copolymerization mentioned therein. Instead of N,N'-azo-bis-isobutyronitrile, one can use organic peroxides, e.g., benzoyl peroxide, acetyl peroxide, benzoyl acetyl peroxide, succinyl peroxide, di-tertiary butyl peroxide and urea peroxide. The concentration of catalyst is usually small, that is, for the preferred "azo" catalyst from by weight, about 1 part to about 8 or 4 parts of catalyst per one hundred parts of the monomeric mixture.

In utilizing the above photopolymerizable polymers as photoreliefs it is sufficient to say that they are suitable for preparing relief images for all types of photomechanical reproduction process. Supports other than the copper clad Fiberglas of Example I may be used. The photopolymerizable compositions may be coated on a lithographic paper, printing plate support carrying a layer repellent to greasy inks. The resulting layer, after exposure and solvent development to reveal the non-image exposed ink repellent areas of the support, can be used directly as a printing plate. Metallic plates of copper, zinc, steel, and aluminum can also be used since the novel polymerizable polymeric compositions have good adhesion to any of these surfaces depending on the proportions used in preparing the polymeric compounds.

Other photoinitiators in addition to the 2-t-butyl-anthraquinone of Example I may, of course, be used, including the specific polynuclear quinones listed in Notley U.S. 2,951,758. There can also be present in the photopolymerizable compositions any of the photoreducible dyes and reducing agents listed in Oster U.S. Pat. 2,850,445; 2,875,047; 3,097,096; and Oster et al., U.S. Pat. 3,074,794; 3,097,097; and 3,145,104. In addition, dyes of the phenazine, oxazine, and quinone classes may be used.

As indicated above various dyes and pigments may be added to increase the visibility of the relief image.

In addition to the plasticizer, triethylene glycol diacetate set forth in Example I, the following exemplary plasticizers and others known in the art may be used: triethylene glycol dipropionate, dibenzyl sebacate, diphenyl phosphate and dibutyl phthalate.

The photoreliefs comprising the photopolymerizable polymeric compositions offer many advantages over the prior art. They are far superior to the bichromated glue or albumin layers because they are much less sensitive to atmospheric conditions and can be sensitized during manufacture. In all cases the photoreliefs of the invention give cleaner images than bichromate plates. The photopolymerizable polymeric compositions do not require an auxiliary binder. They also have the advantage of being soluble in dilute aqueous alkali solutions. The photorelief compositions have resistance to oxygen densitization and oxygen-induced reciprocity failure. The relatively little polymerization required with the products of this invention allows the polymerization to compete with oxygen, a powerful inhibitor of free-radical carbon-to-carbon polymerization. Although the polymerizable acidic polymers have been described with reference to the preparation of photoreliefs, they may be used in other applications, where photopolymers have been useful, for example, in copying, printing, decorating and manufacturing applications. Pigments, e.g., titanium dioxide, colloidal carbon, metal powders, phosphors, etc., and dyes which do not appreciably absorb light at the wave length being used for exposure or which inhibit polymerization, can be incorporated in the photopolymerizable polymeric composition. The compositoins may also be used in color reproductions.

The embodiments of the invention in which an exclusive property or privilege is claimed are defined as follows:

1. The crosslinkable polymeric compounds of the formula:

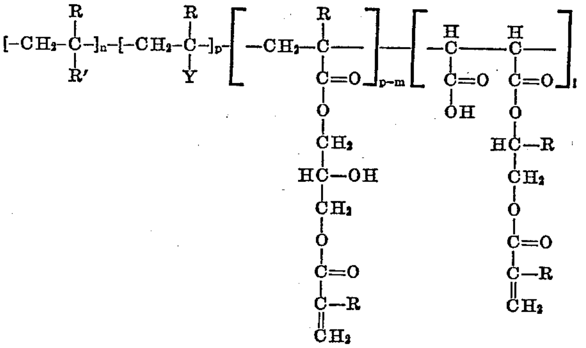

wherein

R' is —C≡N, —O—C(=O)—R, —C(=O)—OR'', —C(=O)—R phosphinate, alkoxy, pyrrolidone or halogen, R is —H or —$CH_3$, R'' is alkoxy, alkyl of 1–18 carbon atoms, cycloalkyl, aralkyl or aryl, Y is one of the radicals: —COOH or

HOOC—Q—COO—$CH_2$—CH(OH)—$CH_2$—O—C(=O)—

Q is alkylene of 1–4 carbon atoms or arylene,

*n* is zero or a positive integer,

*m* is zero or a positive integer,

*p* is zero or a positive integer greater than *m*,

*l* is zero when either *p* or *m* are positive integers and *l* is a positive integer when *p* and *m* are zero.

2. The crosslinkable polymeric compounds of the formula:

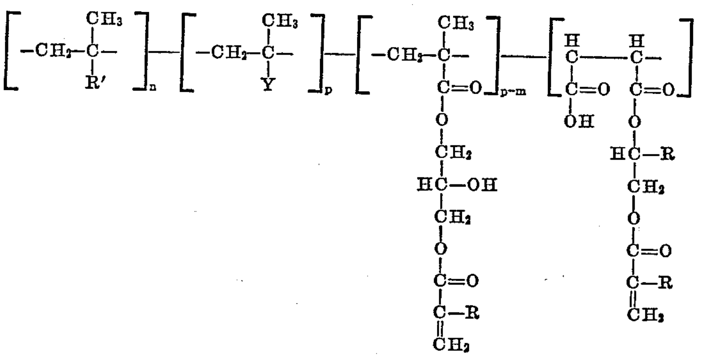

wherein

R' is —C≡N, —O—C(=O)—R, —C(=O)—OR'', —C(=O)—R phosphinate, alkoxy, pyrrolidone or halogen, R is —H or —$CH_3$, R'' is alkoxy, alkyl of 1–18 carbon atoms, cycloalkyl, aralkyl or aryl, Y is one of the radicals: —COOH or

HOOC—Q—COO—$CH_2$—CH(OH)—$CH_2$—O—O(=O)—

Q is alkylene of 1–4 carbon atoms or arylene,

*n* is zero or a positive integer,

*m* is zero or a positive integer,

*p* is zero or a positive integer greater than *m*, $l$ is zero when $p$ or $m$ are positive integers and $l$ is a positive integer when $p$ and $m$ are zero.

3. The crosslinkable polymeric compounds of the formula:

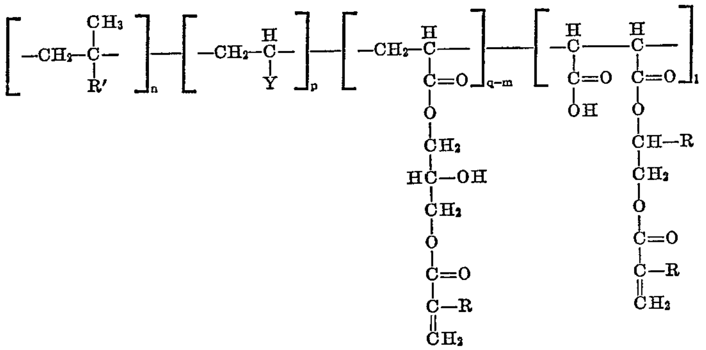

R′ is —C≡N, $-O-C(=O)-R$, $-C(=O)-OR''$, $-C(=O)-R$ phosphinate, alkoxy, pyrrolidone or halogen,
R″ is alkoxy, alkyl of 1–18 carbon atoms, cycloalkyl, aralkyl or aryl,
R is —H or —$CH_3$,
Y is one of the radicals: —COOH or $HOOC-Q-COO-CH_2-CH(OH)-CH_2-O-C(=O)-$ Q is alkylene of 1–4 carbon atoms or arylene,
$n$ is zero or a positive integer,
$m$ is zero or a positive integer,
$p$ is zero or a positive integer greater than $m$,
$l$ is zero when $p$ or $m$ are positive integers and 1 is a positive integer when $p$ and $m$ are zero.

4. The crosslinkable polymeric compound of the formula:

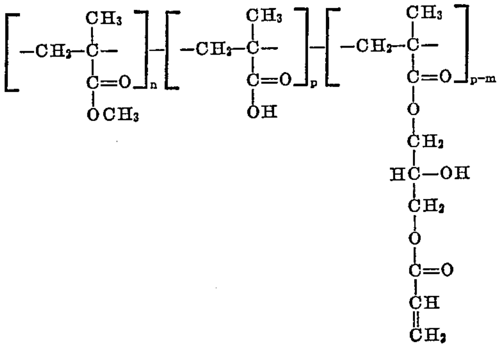

$n$ and $m$ are positive integers and $p$ is a positive integer greater than $m$.

5. The crosslinkable polymeric compound of the formula:

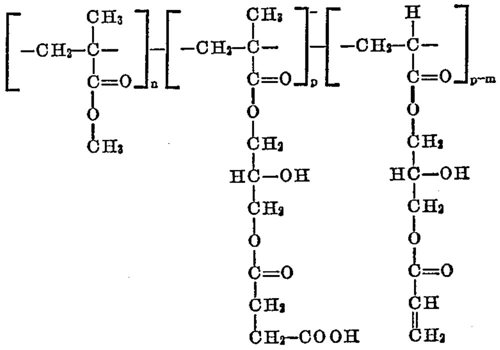

wherein $n$ and $m$ are positive integers and $p$ is a positive integer greater than $m$.

6. The crosslinkable polymeric compound of the formula

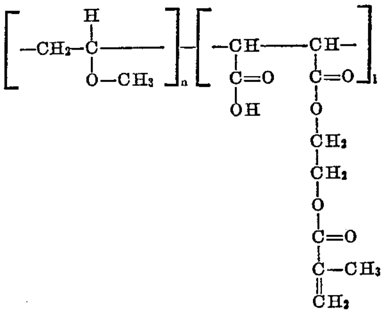

wherein $n$ and 1 are positive integers.

References Cited

UNITED STATES PATENTS 3,366,706 1/1968 Vasta ............ 260—78.5
3,317,453 5/1967 MacDonald et al.

JOSEPH L. SCHOFER, *Primary Examiner.*
JOHN KIGHT III, *Assistant Examiner.*

U.S. Cl. X.R.

96—88; 260—80.8, 80.81, 85.5, 85.7, 86.1